(12) United States Patent
Sahara

(10) Patent No.: US 9,130,577 B2
(45) Date of Patent: Sep. 8, 2015

(54) PLL CIRCUIT

(71) Applicant: Yamaha Corporation, Hamamatsu-shi, Shizuoka-ken (JP)

(72) Inventor: Takuya Sahara, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 14/222,495

(22) Filed: Mar. 21, 2014

(65) Prior Publication Data

US 2014/0285245 A1 Sep. 25, 2014

(30) Foreign Application Priority Data

Mar. 23, 2013 (JP) .................. 2013-061190

(51) Int. Cl.
*H03L 7/08* (2006.01)
*H03L 7/14* (2006.01)

(52) U.S. Cl.
CPC ... *H03L 7/08* (2013.01); *H03L 7/14* (2013.01)

(58) Field of Classification Search
USPC .......... 327/144, 147, 150, 156, 159; 375/375, 375/376
See application file for complete search history.

(56) References Cited

U.S. PATENT DOCUMENTS

| | | | |
|---|---|---|---|
| 5,982,210 A | 11/1999 | Rogers | |
| 6,222,400 B1 * | 4/2001 | Fukuda et al. | ................ 327/151 |
| 7,183,863 B1 | 2/2007 | Bedrosian | |
| 8,350,607 B2 * | 1/2013 | Kwak | ............................ 327/158 |
| 2005/0078783 A1 * | 4/2005 | Okita | ............................ 375/376 |
| 2009/0267661 A1 | 10/2009 | Ootsuki et al. | |
| 2012/0280735 A1 | 11/2012 | Zhang et al. | |

FOREIGN PATENT DOCUMENTS

| | | |
|---|---|---|
| EP | 2 128 987 A1 | 12/2009 |
| JP | 62-39917 A | 2/1987 |
| JP | H10-145230 A | 5/1998 |
| JP | 2000-286702 A | 10/2000 |
| JP | 2001-126411 A | 5/2001 |
| JP | 2007-129306 A | 5/2007 |
| JP | 4606533 B2 | 1/2011 |

OTHER PUBLICATIONS

Extended European Search Report dated Jun. 25, 2014, for EP Application No. 14160829.9, six pages.

(Continued)

*Primary Examiner* — Long Nguyen
(74) *Attorney, Agent, or Firm* — Morrison & Foerster LLP

(57) ABSTRACT

A PLL circuit generating a generated clock in synchronization with an external clock by a phase locked loop includes a first detector for detecting whether or not the generated clock is in synchronization with the external clock, and a measuring device for measuring at least one of a high time from a rise to a fall of the external clock and a low time from a fall to a rise thereof. In a state that the generated clock and the external clock are in synchronization, when it is detected that a fluctuation of the high time or the low time becomes equal to or more than a predetermined value, the PLL circuit fixes a frequency of the generated clock to a frequency outputted at this time point, and continues output of the generated clock having the fixed frequency.

4 Claims, 3 Drawing Sheets

(56) References Cited

OTHER PUBLICATIONS

Anonymous. (Apr. 27, 2005). "Phase Locked Loop Circuits," UCSB/ECE Department, A textbook used in UCSB, see p. 1, "1. Definition" section, retrieved from <http://www.ece.ucsb.edu/~long/ece594a/PLL_intro_594a_s05.pdf>, 46 pages.

Anonymous. (Mar. 2012). "FFX™ audio codec with analog and digital inputs and 2×1.2 W (or 2 100 mW HP) class-D amplifier," ST, Datasheet of the circuit product STA529, manufactured by STMicroelectronics, see p. 21, "Lock-detect circuit" section, retrieved from <http://www.st.com/st-web-ui/static/active/en/resource/technical/document/datasheet/CD00149197.pdf>, 57 pages.

Digrase, N. et al. (Mar. 2013). "International Journal of Advanced Research in Computer Science and Software Engineering," Ijarcsse, vol. 3, issue 3, see the second paragraph of "I. Introduction" section, retrieved from <http://www.ijarcsse.com/docs/papers/Volume_3/3_March2013/V3I3-0193.pdf>, five pages.

Dunbar, S., et al. (Mar. 2008). "Generating Low Phase-Noise Clocks for Audio Data Converters From Low Frequency Word Clock," Texas Instruments, Application Report, see p. 2, "Functional Block Diagram Description" section, retrieved from <http://www.ti.com/lit/an/scaa088/scaa088.pdf>, 14 pages.

Notification of Reason(s) for Refusal mailed Jan. 9, 2015, for Japanese Patent Application No. JP 2013-061190, with English translation, six pages.

* cited by examiner

PLL CIRCUIT

TECHNICAL FIELD

The invention relates to a digital PLL circuit generating a sampling clock used for digital audio signal processing, and particularly relates to a PLL circuit which allows continuing operation on a device which utilizes a generated clock outputted from the PLL circuit as much as possible even when an abnormality is detected in an external clock.

BACKGROUND ART

PTL1 listed below discloses a digital PLL (Phase Locked Loop) circuit generating a sampling clock used for digital audio signal processing. This PLL circuit receives a sampling clock (external clock) supplied together with a digital audio signal from the outside, and generates a sampling clock which is in synchronization with this external clock and has a stable frequency. The generated clock is supplied to various types of audio signal processing circuits (DSP, D/A converter, A/D converter, network I/O, and the like), and in such circuits, various types of audio signal processing (signal processing, D/A conversion, A/D conversion, transmission, reception, and the like) are performed in synchronization with the generated clock. Such a PLL circuit is often incorporated together with an audio signal processing circuit in a casing of an audio device which includes the audio signal processing circuit, but can be provided independently from the audio device.

CITATION LIST

Patent Literature

{PTL1} JP 4606533 B2

SUMMARY OF INVENTION

Technical Problem

In the technology of PTL1, when an event such as "loss of input of the external clock," "loss of synchronization of the external clock with an internal clock," or "change in frequency range of the external clock" is detected, the PLL circuit judges that an abnormality has occurred to the external clock, and switches the reference signal of the PLL circuit from the external clock to the internal clock to continue the operation. In this case, there is a problem that the audio signal has to be muted temporarily when conducting the switching from the external clock to the internal clock.

In addition, there is a time delay in judgment of abnormality related to the external clock as described above, and there has been a defect that frequency of the generated clock fluctuates from when an abnormality occurs in the external clock until when the occurrence thereof is judged.

It is an object of the invention to provide a PLL circuit which suppresses a fluctuation in frequency of the generated clock as much as possible even when an abnormality is detected in an external clock, and is capable of continuing output of audio signal without muting the audio signal as much as possible.

Solution to Problem

To attain the object, a PLL circuit of the invention is a PLL (phase lock loop) circuit receiving an external clock which is a sampling clock supplied together with a digital audio signal from an outside, and generating a generated clock which is a sampling clock in synchronization with the external clock, comprising: a first detector for detecting whether or not a phase of the generated clock is in synchronization with a phase of the external clock; a measuring device for measuring at least one of a high time from a rise to a fall of the external clock and a low time from a fall to a rise thereof; a second detector for detecting, based on a high time or a low time which is presently measured by the measuring device and a high time or a low time which was measured by the measuring device before, presence of a fluctuation of the high time or the low time at a predetermined level or more; and a holding device for fixing, when the second detector detects the presence of a fluctuation of the high time or the low time at the predetermined level or more in a state in which the first detector detects synchronization of the generated clock and the external clock, a frequency of the generated clock to a frequency outputted at this time point, and continuing output of the generated clock having the fixed frequency.

In such a PLL circuit, it is conceivable that the PLL circuit further includes a mute judging device for outputting a signal instructing release of mute of the audio signal as a mute signal while the output of the generated clock having the fixed frequency is continued by the holding device.

It is also conceivable that the PLL circuit further includes: a frequency judging device for judging whether a frequency of the external clock is included in any one of an arbitrary number of frequency ranges set by a user; and a mute judging device for (a) outputting a signal instructing release of muting of the audio signal as a mute signal when the output of the generated clock having the fixed frequency is continued by the holding device, (b) outputting a signal instructing muting of the audio signal as the mute signal when the frequency judging device judges that the frequency of the external clock is not included in any of the frequency ranges or is changed to a different frequency range among the frequency ranges, and (c) keeping a present value of the mute signal unchanged in situations other than the (a) and (b).

It is also conceivable that when the frequency judging device judges that the frequency of the external clock is included in any one of the frequency ranges, the holding device stops the output of the generated clock having the fixed frequency, and restarts a phase following operation by the phase locked loop.

Advantageous Effects of Invention

According to the invention, even when an abnormality occurs in an external clock, this abnormality can be detected very quickly by comparison of a high time or a low time, and consequently, it is possible to switch a PLL circuit very quickly to a state of outputting a generated clock of a fixed frequency. Further, when an abnormality is detected in an external clock, a frequency of the generated clock can be fixed quickly without causing a fluctuation in frequency of the generated clock, and thus it is unnecessary to mute an audio signal during that time. Therefore, even when an abnormality is detected in the external clock, output of the audio signal can be continued without performing a mute of the audio signal as much as possible.

DESCRIPTION OF EMBODIMENTS

Hereinafter, embodiments of the invention will be described using the drawings.

Figure 1:
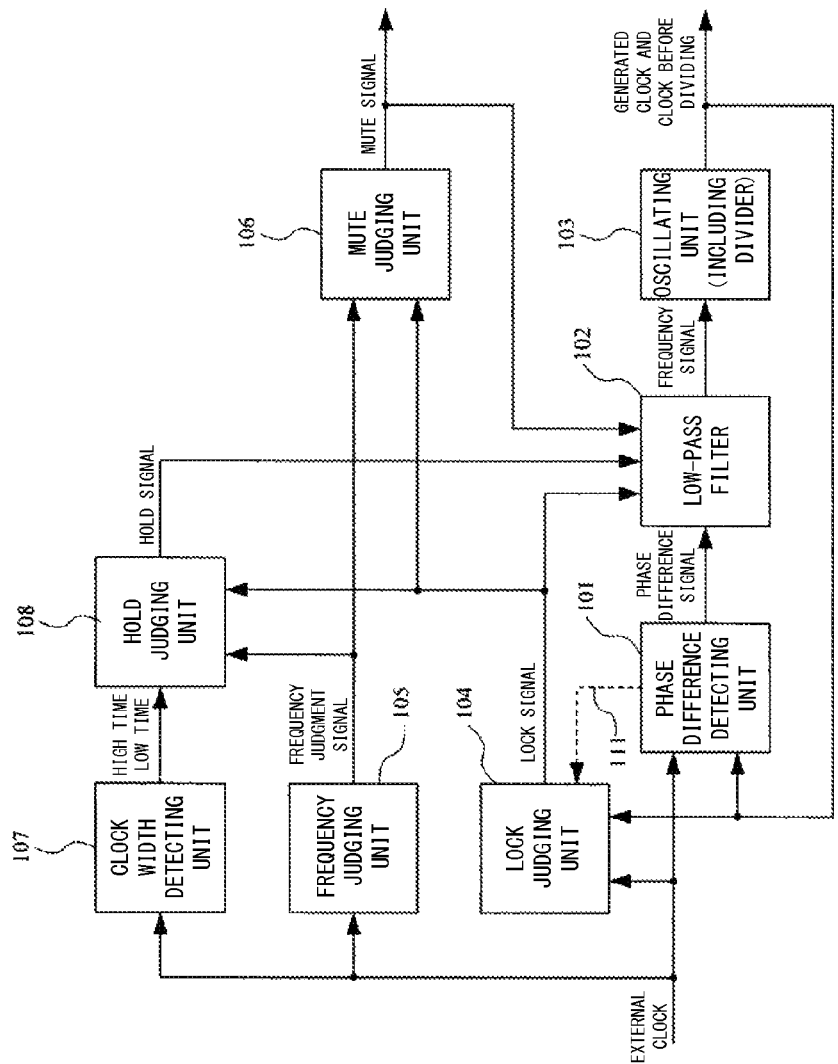
FIG. 1 is a structural diagram of a PLL circuit of an embodiment of the invention.

FIG. 1 is a structural diagram of a PLL circuit which is an embodiment of the invention.

A phase difference detecting unit (first detector) 101 detects a phase difference between a sampling clock (external clock) supplied from the outside and a sampling clock (generated clock) generated in an oscillating unit 103, and outputs a phase difference signal (digital value with an index) illustrating the phase difference. A low-pass filter 102 outputs a frequency signal indicating frequency of an oscillating clock based on the phase difference signal. The low-pass filter 102 increases or decreases magnitude of the frequency signal so that phase of the generated clock follows phase of the external clock, and the detected phase difference decreases. Rate of the phase following is determined by a time constant set to the low-pass filter 102. This time constant can be set in plural stages from a fast following rate to a slow following rate. When the phase following is not performed, the low-pass filter 102 outputs a frequency signal with a fixed value regardless of the phase difference signal from the phase difference detecting unit 101. The oscillating unit 103 oscillates and outputs a generated clock of a frequency corresponding to the frequency signal outputted from the low-pass filter 102. The oscillating unit 103 is actually an accumulator which synchronizes with the sampling clock and, for every sampling cycle, accumulates value of the frequency signal, and outputs a carry signal from a most significant bit as the generated clock. Moreover, an accumulator which accumulates the generated clock may be provided to divide the generated clock.

A lock judging unit 104 judges whether phase of the generated clock is in synchronization with phase of the external clock or not by directly comparing the generated clock and the external clock. Instead of the direct comparison, it may be judged based on the phase difference signal outputted by the phase difference detecting unit 101 (dotted arrow 111). The lock judging unit 104 outputs a lock signal "1" when a continuous synchronization is confirmed over plural clocks, or otherwise outputs a lock signal "0". While the lock signal "0" is inputted, (since it means that the absolute value of the phase difference between the generated clock and the external clock is large) the low-pass filter 102 changes the time constant of the low-pass filter 102 to control the frequency signal such that the phase difference between the generated clock and the external clock becomes small at a following rate as high as possible. Further, while the lock signal "1" is inputted, (since it means that absolute value of the phase difference between the generated clock and the external clock is smaller than a predetermined value and the generated clock and the external clock are synchronized with each other) the low-pass filter 102 changes the time constant of the low-pass filter 102 to control the frequency signal such that the generated clock slowly follows the external clock.

Regarding this PLL circuit, a user sets in advance a frequency range which the PLL circuit follows. As the frequency range, for example, there are prepared three frequency ranges which are ±5% ranges of three specific frequencies, 44.1 kHz, 48 kHz, and 96 kHz being the center. The user designates one or more of these specific frequencies to designate one or more corresponding frequency ranges. Here, one frequency range specified by one specific frequency is described as a "frequency range (specific frequency)".

A frequency judging unit (frequency judging device) 105 detects frequency of the inputted external clock (note that it also detects presence of supply of the external clock, which is a condition of the frequency detection), and judges whether or not this frequency is in any one of the frequency ranges (specific frequencies) designated by the user. This detection of frequency takes a certain time. The frequency judging unit 105 outputs a frequency judgment signal "1" when the frequency of the external clock is in any one of the designated frequency ranges (specific frequencies), or outputs a frequency judgment signal "0" when the frequency is not in any of the designated frequency ranges (specific frequencies). When the external clock is not supplied, the frequency judging unit 105 outputs the frequency judgment signal "0".

Note that in the case where two specific frequencies (for example, 48 kHz and 96 kHz) are designated to designate two frequency ranges, when frequency of the external clock changes, from a state in which frequency of the external clock is included in one (for example, 48 kHz) of the two frequency ranges and the generated clock (48 kHz) in synchronization with the external clock is oscillated, to another frequency range (96 kHz), the frequency judging unit 105 judges that the external clock once became out of the one frequency range (48 kHz) and outputs the frequency judgment signal "0", and thereafter outputs the frequency judgment signal "1" again when it is confirmed that frequency of the external clock is in the above another frequency range.

A mute judging unit (mute judging device) 106 outputs a mute signal having an either value of "0" to release a mute of an audio signal and "1" to instruct the mute based on the lock signal from the lock judging unit 104 and the frequency judgment signal from the frequency judging unit 105. The mute judging unit 106 sets value of the mute signal to be outputted to "0" when the lock signal is "1", or to "1" when the frequency judgment signal is "0", or otherwise retains the present value (does not change it). That is, when the external clock comes in a certain frequency range (specific frequency) and the lock is completed due to phase following, the mute signal is changed to "0" to release the mute, or when the external clock which has been in a certain frequency range (specific frequency) is no longer included in any one of the frequency ranges (specific frequencies) or shifts to another frequency range (specific frequency), the mute signal is changed to "1" to start the mute. The mute signal from the mute judging unit 106 is used in an audio device of FIG. 4, which will be described later.

A clock width detecting unit (measuring device) 107 measures each of a time length in which the inputted external clock is high (=1) and a time length in which it is low (=0), and outputs a high time and a low time indicating the measured time lengths.

Figure 2:
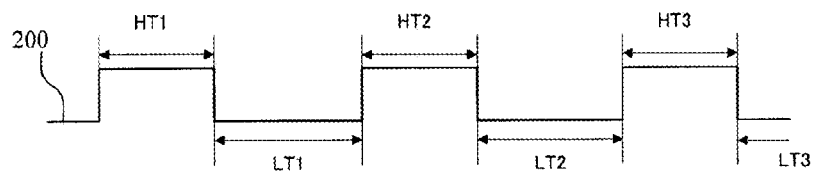
FIG. 2 is an explanatory diagram of time lengths detected by a clock width detecting unit.

FIG. 2 illustrates an example of the time lengths detected by the clock width detecting unit 107. 200 denotes an external clock. In the diagram, a horizontal axis denotes time, and a vertical axis denotes voltage.

The diagram illustrates a later time as it goes rightward, and higher voltage as it goes upward. HT1, HT2 and HT3 are high times detected by the clock width detecting unit 107, and LT1, LT2 and LT3 are low times detected by the clock width detecting unit 107. The clock width detecting unit 107 outputs values of the detected high time and low time at timings on the end (right end in the diagram) of the respective high time and low time.

Referring back to FIG. 1, the clock width detecting unit 107 outputs the detected high time and low time sequentially to a hold judging unit 108. The hold judging unit 108 compares the latest inputted high time with a previously inputted high time, and judges whether the difference thereof (fluctuation of high time) is in a predetermined range or not. Further, the hold judging unit 108 compares the latest inputted low time with a previously inputted low time, and judges whether the difference thereof (fluctuation of low time) is in a predetermined range or not. Note that rather than one value in the past, the latest value may be compared with a combined value of n values in the past (for example, an average value, a weighted average value, an average value excluding a maximum value and a minimum value, or the like).

When a hold signal being outputted is "0", the lock signal is "1", and it is detected that the fluctuation of the high time or low time has become out of the predetermined range, the hold judging unit (second detector and holding device) 108 changes the hold signal from "0" to "1". Further, when the hold signal being outputted is "1" and the frequency judgment signal is "1", the hold judging unit 108 changes the hold signal from "1" to "0". This hold signal is inputted to the low-pass filter 102. While receiving this hold signal "0", the low-pass filter 102 performs processing of phase following, that is, low-pass processes the phase difference signal and outputs a frequency signal with a gradually varying value. Further, while receiving the hold signal "1", the low-pass filter 102 does not change value of the frequency signal to be outputted. That is, without performing the following operation based on the phase difference signal, the low-pass filter 102 keeps outputting, in a fixed manner, the value of the frequency signal at a point when the low-pass filter 102 received the hold signal "1".

When the phase and/or frequency of the external clock fluctuates (the high time or low time fluctuates equal to or more than a predetermined width) in a situation that the generated clock is in synchronization with (locked to) the external clock (the lock signal "1"), the hold judging unit 108 immediately changes the hold signal to "1" to fix an oscillation frequency. At this time, when the frequency range of the external clock has not changed (the frequency judgment signal "1" continues), the mute judging unit 106 continues outputting the mute signal "0", and the mute of the audio signal is not performed. Further, when the external clock comes in any one of the designated frequency ranges in a situation that the oscillation frequency of the generated clock is fixed (the hold signal "1"), the hold judging unit 108 changes the hold signal to "0", and thereby the PLL circuit starts the phase following to this external clock.

Figure 3:
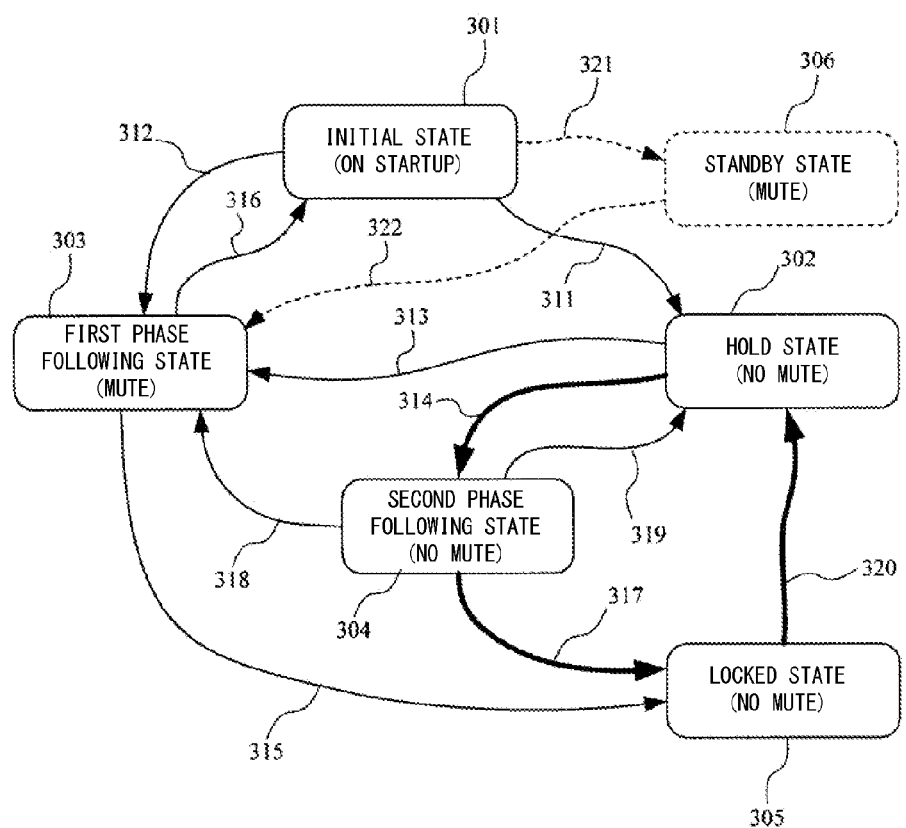
FIG. 3 is a state transition diagram of the PLL circuit of the embodiment.

FIG. 3 illustrates a state transition diagram in the PLL circuit of FIG. 1. This PLL circuit takes a state of one of [initial state] 301, [hold state] 302, [first phase following state] 303, [second phase following state] 304, and [locked state] 305. Each state of FIG. 3 corresponds to one combination of states of respective parts of the PLL circuit described in FIG. 1. Note that [standby state] 306 will be described in modification examples which will be described later.

This PLL circuit takes the [initial state] 301 on startup (when powered on or reset). In the [initial state] 301, initialization of the respective units in the circuit is performed, but at this point, stable generated clock cannot be guaranteed and thus the mute signal "1" is outputted. Transition conditions from the [initial state] 301 will be described. First, when supply of the external clock is not detected by the frequency judging unit 105 or the external clock is detected but the frequency thereof is not included in any one of the designated frequency ranges, the low-pass filter 102 is set so as to output a frequency signal illustrating the designated one specific frequency (when plural specific frequencies are designated, one among them is chosen appropriately by a method such as choosing the highest (or lowest) frequency) and the mute judging unit 106 is initially set so as to output the mute signal "0", and thereafter the state shifts to the [hold state] 302 (arrow 311). When the external clock is detected and the frequency of the external clock is included in one of the frequency ranges, the frequency signal of the low-pass filter 102 is set to the initial value (for example, the specific frequency) corresponding to the frequency range of this external clock, and the state shifts to the [first phase following state] 303 (arrow 312).

In the [hold state] 302, the low-pass filter 102 outputs a value-fixed frequency signal. That is, the low pass filter 102 keeps outputting the frequency signal which the low pass filter 102 had outputted when entering the [hold state] 302. In the [hold state] 302, the following of phase is not performed, and the oscillating unit 103 keeps outputting the generated clock of the frequency at the time of entering the [hold state] 302. Further, in this state, the mute judging unit 106 keeps outputting the mute signal "0", and the mute of the audio signal is not performed in a signal processing unit 412, which will be described later.

Transition conditions from the [hold state] 302 will be described. In the [hold state] 302, when supply of the external clock is detected by the frequency judging unit 105 and the frequency of the external clock is included in any one of the designated frequency ranges, the state shifts to the [first phase following state] 303 or the [second phase following state] 304 as follows. First, when the frequency range of the external clock is different from the frequency range of the current generated clock (that is, the frequency range of the frequency indicated by the frequency signal currently outputted by the low-pass filter 102 is different from the frequency range of the external clock detected by the frequency judging unit 105, the low-pass filter 102 is set so as to output a frequency signal indicating the initial value (for example, specific frequency) corresponding to the frequency range of the detected external clock, and the state shifts to the [first phase following state] 303 (arrow 313). In this case, the frequency judging unit 105 outputs the frequency judgment signal "0" at a point when it judges that the frequency of the external clock has changed, and thus the mute judging unit 106 outputs the mute signal "1", by which the mute is executed immediately. On the other hand, when the frequency range of the external clock is the same as the frequency range of the current generated clock (that is, the frequency range of the frequency indicated by the currently outputted frequency signal is the same as the frequency range of the detected external clock), the state then shifts to the [second phase following state] (arrow 314).

In the [first phase following state] 303, phase following by the phase difference detecting unit 101, the low-pass filter 102, and the oscillating unit 103 is performed. That is, the low-pass filter 102 increases or decreases the frequency signal based on the phase difference signal from the phase difference detecting unit 101. Specifically, the low-pass filter 102 adds the phase difference signal (feeds back the phase difference signal) multiplied by the time constant to a previous frequency signal (past value), to thereby generate a new frequency signal (present value). At this time, a value that provides a fast following rate is set to the time constant of the low-pass filter 102 until it begins to be locked. Further, since it is not locked (lock signal is "0"), the mute signal "1" is outputted from the mute judging unit 106, and hence the mute is performed. In the [first phase following state] 303, since the mute is performed, increasing the following rate of the low-pass filter 102 would not cause a problem.

Transition conditions from the [first phase following state] 303 will be described. In the [first phase following state] 303, when the lock judging unit 104 detects that the generated clock is in synchronization with the external clock, the state shifts to the [locked state] 305 (arrow 315). If supply of the external clock is not detected or the external clock is not included in any one of the designated frequency ranges (it is not an effective external clock), the state shifts to the [initial state] 301 (arrow 316). Note that in this case, instead of shifting to the [initial state] 301, it may be configured to set the low-pass filter 102 to output a fixed frequency signal so that the generated clock of the above-described specific frequency (or one of plural specific frequencies if present) is oscillated, and set the mute judging unit 106 to output the mute signal "0", and the state shifts to the [hold state] 302.

In the [second phase following state] 304, similarly to the [first phase following state] 303, control is performed to make phase of the generated clock follow the phase of the external clock. Here, the mute judging unit 106 outputs the mute signal "0", and the audio signal is outputted without being muted. Therefore, a long time constant, that is, a slow following rate is set to the low-pass filter 102, so as to prevent deterioration of quality of audio signals to be outputted by a rapid fluctuation of the sampling clock.

Transition conditions from the [second phase following state] 304 will be described. In the [second phase following state] 304, when the lock judging unit 104 detects that the generated clock is in synchronization with the external clock, the state shifts to the [locked state] 305 (arrow 317). When it is detected that the external clock has changed to another frequency range, the frequency signal of the low-pass filter 102 is set at the initial value corresponding to that frequency range, and the state shifts to the [first phase following state] 303 (arrow 318). Note that when the state shifts to the [first phase following state] 303 by arrow 318, the frequency judging unit 105 outputs the frequency judgment signal "0" when it judges that frequency of the external clock has changed, and thus the mute judging unit 106 outputs the mute signal "1", thereby the mute is executed immediately. The situation that "the external clock has changed to another frequency range" includes both the case in which frequency of the inputted external clock has changed and it is no longer included in any of the designated frequency ranges, and the case in which plural frequency ranges are set and frequency of the external clock changes from one designated frequency range to another designated frequency range. In the [second phase following state] 304, when the external clock is no longer detected, the state shifts to the [hold state] 302 (arrow 319).

In the [locked state] 305, similarly to the [second phase following state] 304, control is performed to make phase of the generated clock follow the phase of the external clock. As the time constant that determines the following rate of the low-pass filter 102, a time constant that provides a slow following rate is constantly set. In the [locked state] 305, the mute judging unit 106 outputs the mute signal "0", and thus the mute is not performed.

Note that the [locked state] 305 and the [second phase following state] 304 are the same in that a similar phase following operation is performed and the mute is not performed, but are different in that in the [locked state] 305, (synchronization and lock of phases of the generated clock and the external clock are confirmed, and) the lock judging unit 104 outputs the lock signal "1", whereas in the [second phase following state] 304, (lock is released because of being through the [hold state] 302, and) the lock signal "0" is outputted.

Transition conditions from the [locked state] 305 will be described. In the [locked state] 305, when it is detected that fluctuation of the high time or low time is equal to or more than a predetermined value, the hold judging unit 108 outputs the hold signal "1", and the state shifts to the [hold state] 302 (arrow 320). In the [locked state] 305, when it is detected that the lock is released or the external clock is no longer detected, the state should shifts to the [hold state] 302, but judgment of hold start based on the high time or low time of the hold judging unit 108 can always be performed before judgment of unlock by the lock judging unit 104 or judgment of no external clock by the frequency judging unit 105. Thus, as the transition here, judgment based on the high time and/or low time will suffice.

Figure 4:
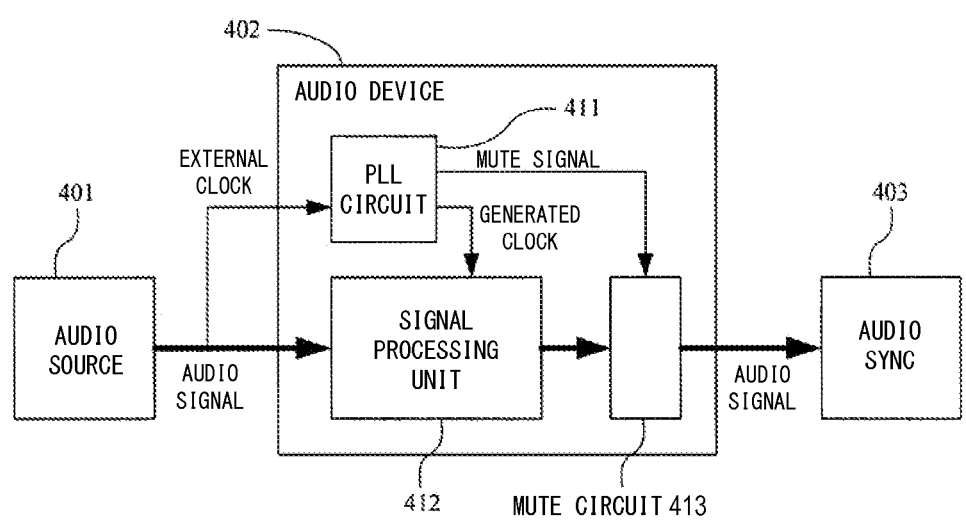
FIG. 4 is an overall diagram of an audio device to which a PLL circuit of the embodiment is applied.

FIG. 4 is an overall diagram of an audio device to which a PLL circuit of the above-described embodiment is applied. 401 denotes an audio source which outputs a digital audio signal in synchronization with a sampling clock (external clock). It is, for example, an A/D converter which converts an analog audio signal from a microphone or the like to digital signal and outputs the converted signal, a reproducer which reproduces a recorded digital audio signal, or the like. 402 denotes an audio device which inputs a digital audio signal and an external clock from the audio source 401, performs various types of signal processing on this audio signal in synchronization with the sampling clock (generated clock), which is in synchronization with this external clock, and outputs the processed audio signal. 403 is an audio sync which receives an audio signal outputted from the audio device 402, for example a device which D/A converts the received audio signal and releases sounds via a speaker, a headphone, and/or the like based on the converted signal.

The audio device 402 includes a PLL circuit 411 of the above-described embodiment. The PLL circuit 411 outputs the generated clock which is in synchronization with the external clock accompanying the audio signal and whose frequency and phase are stable. A signal processing unit 412 performs various types of signal processing in synchronization with the generated clock, which is in synchronization with the external clock, and hence can directly process the audio signal from the audio source 401 without converting it by an SRC (sample rate converter). The mute signal which the PLL circuit 411 outputs is inputted to a mute circuit 413. The mute circuit 413 mutes the audio signal from the signal processing unit 412 when the mute signal is "1", and outputs a soundless audio signal (whose sound volume level is zero). That is, output of an audio signal which substantially represents sounds is prevented. Further, when the mute signal is "0", the audio signal from the signal processing unit 412 is let through and is outputted to the audio sync 403. Thus, an audio signal with sounds whose sound volume level is not zero is outputted to the audio sync 403.

A first modification example of the above-described embodiment will be described. The first modification example is to stand by without generating the sampling clock until the external clock (effective external clock) of the designated frequency range is supplied on startup. Here, a [standby state] 306 is added to the state transition diagram of FIG. 3. Then, in the [initial state] 301, when no external clock is detected in any of the designated frequency ranges, the state then shifts to the [standby state] 306 (arrow 321). The [standby state] 306 is a state that the external clock of any of the designated frequency ranges is not detected, and the frequency judging unit 105 outputs the frequency judgment signal "0". At this time, the mute judging unit 106 outputs the mute signal "1", and thus the mute of the audio signal is performed. In the [standby state] 306, when it is detected that the external clock is in any one of the designated frequency ranges, the low-pass filter 102 is set to output the frequency signal of the initial value corresponding to this detected frequency range, and the state shifts to the [first phase following state] 303 (arrow 322). In the first modification example, there is no transition to the [hold state] 302 by the arrow 311, and a shift to the [hold state] 302 is made by one of the arrows 319, 320. Thus, frequency of the generated clock outputted in the [hold state] 302 is always substantially the same frequency as the external clock which is supplied most recently, and the generated clock with a frequency for which the external clock is not supplied would not be outputted.

A second modification example of the above-described embodiment will be described. In the second modification example, the above-described [standby state] 306 is added, and the user can select in advance whether the state shifts to the [hold state] 302 or to the [standby state] 306 when the external clock is absent on startup. Then, in the [initial state] 301, when no external clock (effective external clock) in a set frequency is detected, if the "standby" is chosen, the state then shifts to the [standby state] 306 (arrow 321), or if a "hold" is chosen, the low-pass filter 102 is set to output the frequency signal indicating the designated one specific frequency, and the mute judging unit 106 is set to output the mute signal "0", thereby shifting to the [hold state] 302 (arrow 311). On the other hand, in the [initial state] 301, when the external clock (effective external clock) of a designated frequency range is detected, the low-pass filter 102 is set to output the frequency signal indicating an initial value of the frequency range of this external clock, thereby shifting to the [first phase following state] 303 (arrow 312). Thus, in the second modification example, when no effective external clock is supplied on startup, the user can appropriately choose to start output of the generated clock at a unique frequency for the time being, or start output of the generated clock after detecting supply of an effective external clock.

A third modification example of the above-described embodiment will be described. In the third modification example, the user can select "to or not to synchronize with the external clock." In the state transition diagram[, fixed state] is added (not illustrated). In the [fixed state], the low-pass filter 102 outputs, in a fixed manner, the frequency signal corresponding to the specific frequency (or one of plural specific frequencies if present), and does not perform the phase following. Further, the mute is not performed, and thus the audio signal from the signal processing unit 412 is outputted. On actual startup, the operation of the above-described embodiment is performed when the user has selected "to synchronize with the external clock." When the user has selected "not to synchronize with the external clock," the state shifts to the [fixed state] immediately after the start up. There is no transition condition from the [fixed state]. It remains in the [fixed state] until the user selects "to synchronize with the external clock."

In the above-described embodiment and the modification examples thereof, the user designates one or more specific frequencies separately in advance based on frequency range(s) of external clock(s) expected in the audio source and the frequency range corresponding to the specific frequency is set, but there are many variations of this. For example, number of the specific frequency designated by the user may be limited to one, so that only one frequency range is set. In this case, once the state enters the [locked state] 305, transition occurs only among the three states, the [locked state] 305, the [hold state] 302, and the [second phase following state] 304, and the mute of the audio signal no longer occurs.

Alternatively, the PLL circuit may be configured to set all the frequency ranges that can be followed without accepting designation of a specific frequency range from the user. Automatic following is performed to the external clock in any frequency range that can be followed, so as to output the generated clock.

Alternatively, the PLL circuit may be configured such that, rather than accepting designation of a specific frequency separately, plural sets of combinations of specific frequencies are prepared in advance, and the user selects one set from among them, thereby setting the frequency range or ranges corresponding to the one or more specific frequencies included in the selected combination.

Moreover, the PLL circuit may be configured to be operable in any one of the variations, and the user can select a variation to be utilized among them.

REFERENCE SIGNS LIST

101 . . . phase difference detecting unit, 102 . . . low-pass filter, 103 . . . oscillating unit, 104 . . . lock judging unit, 105 . . . frequency judging unit, 106 . . . mute judging unit, 107 . . . clock width detecting unit, 108 . . . hold judging unit

The invention claimed is:

1. A PLL (phase locked loop) circuit receiving an external clock which is a sampling clock supplied together with a digital audio signal from an outside, and generating a generated clock which is a sampling clock in synchronization with the external clock, comprising:
   a first detector for detecting whether or not a phase of the generated clock is in synchronization with a phase of the external clock;
   a measuring device for measuring at least one of a high time from a rise to a fall of the external clock and a low time from a fall to a rise thereof;
   a second detector for detecting:
      a fluctuation of the high time greater than or equal to a predetermined level based on a latest value of the high time measured by the measuring device and one or more values of the high time measured by the measuring device previously, or
      a fluctuation of the low time greater than or equal to a predetermined level based on a latest value of the low time measured by the measuring device and one or more values of the low time measured by the measuring device previously; and
   a holding device for fixing, when the second detector detects the fluctuation during a state in which the first detector detects synchronization of the generated clock and the external clock, a frequency of the generated clock to a first frequency at a present time point, and continuing output of the generated clock having the first frequency.

2. The PLL circuit according to claim 1, further comprising a mute judging device for outputting a signal instructing release of mute of the audio signal as a mute signal while the output of the generated clock having the first frequency is continued by the holding device.

3. The PLL circuit according to claim 1, further comprising:
   a frequency judging device for judging whether a frequency of the external clock is included in any one of an arbitrary number of frequency ranges set by a user; and
   a mute judging device for (a) outputting a signal instructing release of muting of the audio signal as a mute signal when the output of the generated clock having the first frequency is continued by the holding device,
(b) outputting a signal instructing muting of the audio signal as the mute signal when the frequency judging device judges that the frequency of the external clock is not included in any of the frequency ranges or is changed to a different frequency range among the frequency ranges, and
(c) keeping a present value of the mute signal unchanged in situations other than the (a) and (b).

4. The PLL circuit according to claim 3,
wherein when the frequency judging device judges that the frequency of the external clock is included in any one of the frequency ranges, the holding device stops the output of the generated clock having the first frequency, and restarts a phase following operation by the phase locked loop.

\* \* \* \* \*